US012757768B2

(12) United States Patent
Morinaga

(10) Patent No.: US 12,757,768 B2
(45) Date of Patent: Oct. 6, 2026

(54) SEMICONDUCTOR MODULE

(71) Applicant: SHINDENGEN ELECTRIC MANUFACTURING CO., LTD., Tokyo (JP)

(72) Inventor: Yuji Morinaga, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 411 days.

(21) Appl. No.: 18/604,495

(22) Filed: Mar. 14, 2024

(65) Prior Publication Data

US 2024/0312922 A1 Sep. 19, 2024

(30) Foreign Application Priority Data

Mar. 16, 2023 (JP) ................................ 2023-042366

(51) Int. Cl.

*H10W 70/65* (2026.01)
*H10W 44/00* (2026.01)
*H10W 70/60* (2026.01)
*H10W 72/50* (2026.01)
*H10W 90/00* (2026.01)

(52) U.S. Cl.

CPC ......... *H10W 70/65* (2026.01); *H10W 44/501* (2026.01); *H10W 70/611* (2026.01); *H10W 90/00* (2026.01); *H10W 72/5524* (2026.01); *H10W 90/754* (2026.01)

(58) Field of Classification Search

CPC ......... H10W 70/65–656; H10W 20/40; H10W 70/60; H10W 90/754–757; H10W 90/90; H10W 90/701; H10W 90/00–15; H03K 17/6871; H02M 7/162

See application file for complete search history.

(56) References Cited

U.S. PATENT DOCUMENTS

2016/0351488 A1* 12/2016 Kamiyama ........... H02M 7/003
2018/0366567 A1* 12/2018 Morinaga ............. H02M 3/335
2021/0104499 A1 4/2021 Hori et al.
2021/0175158 A1* 6/2021 Yoshii ................. H10W 40/611
2022/0093572 A1* 3/2022 Hirakawa ........... H10W 40/255

FOREIGN PATENT DOCUMENTS

CN 112599486 A 4/2021
CN 115132677 A 9/2022
WO 2020241239 A1 12/2020

* cited by examiner

*Primary Examiner* — Steven B Gauthier
*Assistant Examiner* — Candice Chan
(74) *Attorney, Agent, or Firm* — HAUPTMAN HAM, LLP

(57) ABSTRACT

In a semiconductor module including four semiconductor chips, first and second power terminals, and first and second intermediate points, a bridge circuit is formed. The first power terminal and second power terminal are disposed adjacently to each other, the first intermediate point and second intermediate point are disposed adjacently to each other. At a time of using the semiconductor module, currents flow in opposite directions with respect to the first power terminal and the second power terminal, currents flow in opposite directions with respect to the first intermediate point and the second intermediate point. An outer lead portion of the first power terminal and an outer lead portion of the second power terminal, and an outer lead portion of the first intermediate point and an outer lead portion of the second intermediate point, are disposed on a same side of the semiconductor module.

4 Claims, 7 Drawing Sheets

SEMICONDUCTOR MODULE

RELATED APPLICATIONS

The present application claims priority to Japanese Application Number 2023-042366, filed Mar. 16, 2023, the disclosures of which is hereby incorporated by reference herein in its entirety.

TECHNICAL FIELD

The present invention relates to a semiconductor module.

BACKGROUND ART

Conventionally, there has been popularly adopted a configuration where a bridge circuit is formed of a plurality of semiconductor chips. In the bridge circuit, there is a case where an electric power loss or ringing occurs attributed a parasitic inductance in a circuit. Particularly, in a case where a wide band gap semiconductor is used as a semiconductor chip, such a semiconductor exhibits a high through rate and a high operation frequency, an electric power loss or ringing is likely to be generated due to a parasitic inductance in a circuit. The magnitude of the parasitic inductance largely depends on a wiring path length (also referred to as a current path length) and hence, the modularization of a circuit is also considered for reducing the parasitic inductance (see patent literature 1, for example).

In a semiconductor device 900 disclosed in patent literature 1, a current path when both a first semiconductor chip Q1 and a fourth semiconductor chip Q4 are in an ON state, as indicated by a solid line A in FIG. 7, is a path where a current flows from a first power source terminal 911 to the first semiconductor chip Q1 and reaches a first intermediate point terminal 921, and flows to a load not illustrated in the drawing from the first intermediate point terminal 921 and, thereafter, flows from a second intermediate point terminal 922 to a second power source terminal 912 via the fourth semiconductor chip Q4.

On the other hand, a current path when both a third semiconductor chip Q3 and a second semiconductor chip Q2 are in an ON state is, as illustrated by a broken line B in FIG. 7, a path where a current flows from the first power source terminal 911 and reaches the second intermediate point terminal 922 via the third semiconductor chip Q3, passes through the load not illustrated in the drawing from the second intermediate point terminal 922 and, thereafter, passes the second semiconductor chip Q2 from the first intermediate point terminal 921, and reaches the second power source terminal 912.

In a state where both the first semiconductor chip Q1 and the fourth semiconductor chip Q4 are in an ON state, both the third semiconductor chip Q3 and the second semiconductor chip Q2 are in an OFF state. On the other hand, in a state where both the third semiconductor chip Q3 and the second semiconductor chip Q2 are in an ON state, both the first semiconductor chip Q1 and the fourth semiconductor chip Q4 are in an OFF state. In the description made below, the description with respect to the state where both semiconductor chips are in an OFF state is omitted.

CITATION LIST

Patent Literature

PTL 1: PCT No. 2020/241239

SUMMARY OF INVENTION

Technical Problem

However, the semiconductor module having the current paths described above is merely obtained by simply performing the modularization of a circuit and hence, an effect of reducing a parasitic inductance is insufficient. This state is considered as a drawback of the above-mentioned semiconductor module.

The present invention has been made to overcome such drawbacks, and it is an object of the present invention to provide a semiconductor module that can realize the reduction of a parasitic inductance.

Solution to Problem

A semiconductor module according the present invention is a semiconductor module including: a plurality of semiconductor chips; a first power source terminal; a second power source terminal; a first intermediate point terminal and a second intermediate point terminal thus forming a bridge circuit in the semiconductor module, wherein the first power source terminal and the second power source terminal are disposed adjacently to each other, the first intermediate point terminal and the second intermediate point terminal are disposed adjacently to each other, and at a time using the semiconductor module, currents flow in opposite directions with respect to the first power source terminal and the second power source terminal, and currents flow in opposite directions with respect to the first intermediate point terminal and the second intermediate point terminal, and an outer lead portion of the first power source terminal and an outer lead portion of the second power source terminal, and an outer lead portion of the first intermediate point terminal and an outer lead portion of the second intermediate point terminal are disposed on a same side of the semiconductor module.

Advantageous Effects of the Present Invention

In the semiconductor module of the present invention, the first power source terminal and the second power source terminal are disposed adjacently to each other, the first intermediate point terminal and the second intermediate point terminal are disposed adjacently to each other, and at a time of using the semiconductor module, currents flow in opposite directions with respect to the first power source terminal and the second power source terminal, and currents flow in opposite directions with respect to the first intermediate point terminal and the second intermediate point terminal. Accordingly, in the semiconductor module according to the present invention, it is possible to make a magnetic field generated in the first power source terminal and a magnetic field generated in the second power source terminal cancel each other, and it is possible to make a magnetic field generated in the first intermediate point terminal and a magnetic field generated in the second intermediate point terminal cancel each other. Accordingly, it is possible to provide a semiconductor module that can reduce a parasitic inductance.

DESCRIPTION OF EMBODIMENTS

Hereinafter, an embodiment of the semiconductor module of the present invention is described.

Figure 1:
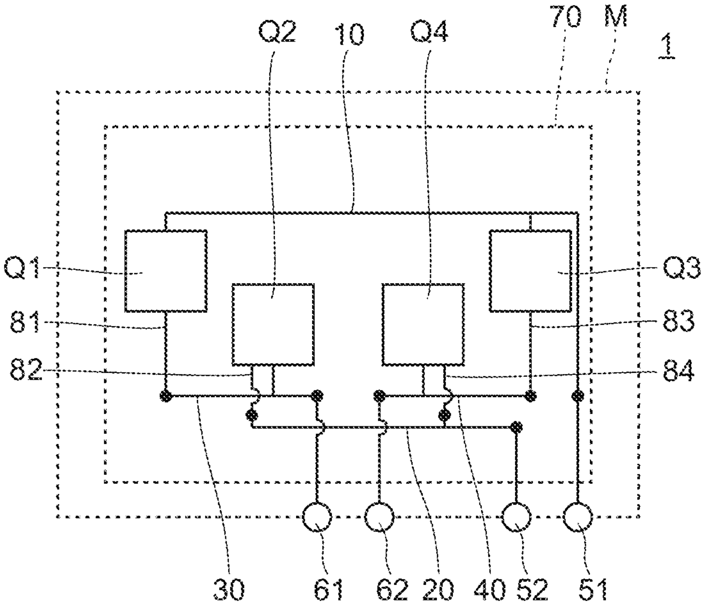
FIG. 1 is a conceptual view of a semiconductor module 1 according to an embodiment.

FIG. 1 is a conceptual view of a semiconductor module 1 according to an embodiment. FIG. 1 that is the conceptual view is a view that illustrates constitutional elements (members) that constitute main current paths (current paths through which relatively large current flows excluding current paths of a control system and a detection system). Black dots in FIG. 1 are dots for indicating boundaries between the constitutional elements.

Figure 2:
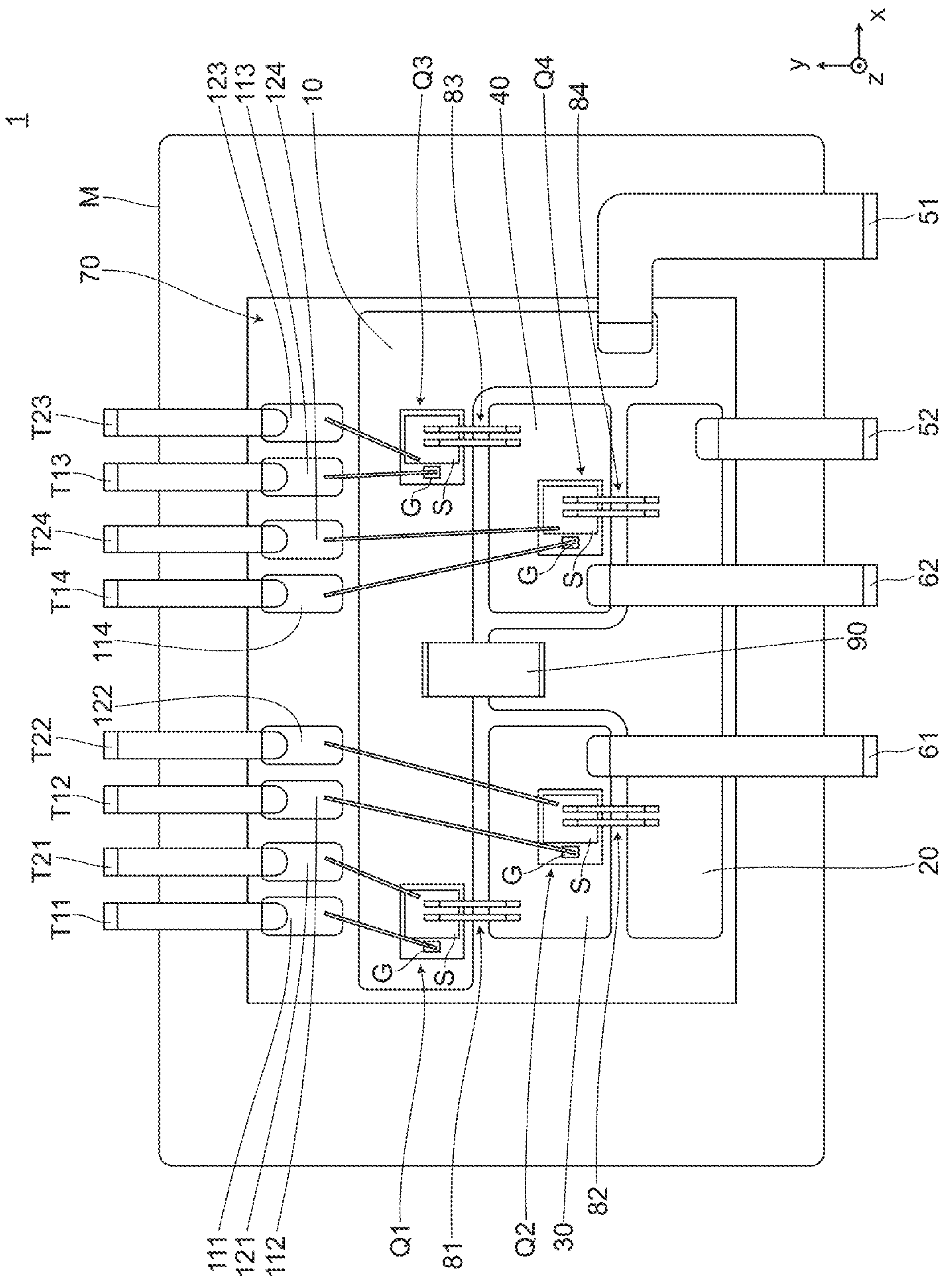
FIG. 2 is a plan view of the internal configuration of the semiconductor module 1 according to the embodiment.

FIG. 2 is a plan view of the internal configuration of the semiconductor module 1 according to the embodiment.

Hereinafter, the internal configuration of the semiconductor module 1 according to an embodiment is described with reference to FIG. 1 and FIG. 2.

The semiconductor module 1 according to the embodiment incudes: as illustrated in FIG. 1 and FIG. 2, a plurality of semiconductor chips, a first power source terminal 51; a second power source terminal 52; a first intermediate point terminal 61; and a second intermediate point terminal 62, and a bridge circuit is formed in the semiconductor module 1. The semiconductor module 1 also includes first to fourth wiring patterns (conductive patterns) 10 to 40. The plurality of semiconductor chips in the semiconductor module 1 are first to fourth semiconductor chips Q1 to Q4. In the bridge circuit of the semiconductor module 1, the first semiconductor chip Q1 and the third semiconductor chip Q3 are chips on a high side, and the second semiconductor chip Q2 and the fourth semiconductor chip Q4 are chips on a low side. In such a bridge circuit, an operation that turns on the first semiconductor chip Q1 and the fourth semiconductor chip Q4, and an operation that turns on both the third semiconductor chip Q3 and the second semiconductor chip Q2 are alternately repeated.

The first to fourth wiring patterns 10 to 40 are formed of the first wiring pattern 10, the second wiring pattern 20, the third wiring pattern 30 and the fourth wiring pattern 40. In the description made hereinafter, in a case where the first to fourth semiconductor chips Q1 to Q4 are collectively described, "first", "second", and the like be may omitted and the expression "semiconductor chips Q1 to Q4" may be adopted. Further, the first to fourth wiring patterns 10 to 40 may be also expressed as "wiring patterns 10 to 40" by omitting "first", "second", and the like in a case where the first to fourth wiring patterns 10 to 40 are collectively described.

In the semiconductor module 1 according to the embodiment, the description is made by assuming the semiconductor chips Q1 to Q4 are each formed of a metal oxide semiconductor field effect transistor (MOSFET), and have a rectangular shape in a plan view. Further, in the semiconductor module 1 according to the embodiment, assume that on a direct copper bonding (DCB) substrate 70 that is formed by directly bonding metal (copper) to a base made of ceramic (alumina, aluminum nitride, silicon nitride or the like), the wiring patterns 10 to 40 are formed. The substrate used in the semiconductor module of the present invention is not limited to the DBC substrate, and other ceramic substrates such as an active metal brazing (AMB), a metal base substrate such as a copper base or an aluminum base and the like can be also used. As metal bonded to the ceramic substrate, metal other than copper (for example, aluminum) can be also used.

The semiconductor chips Q1 to Q4 each include a source electrode (a first electrode) S, a drain electrode (a second electrode) D, and a gate electrode (a control electrode) G. The drain electrode D in a case where a vertical transistor chip (a vertical transistor chip such as a MOSFET or the like formed using Si or SiC material) is used as the semiconductor chips Q1 to Q4, is formed on a surface of the semiconductor chips Q1 to Q4 on surfaces of wiring patterns 10 to 40 side (a back surfaces of semiconductor chips Q1 to Q4). In the semiconductor module 1 according to the embodiment, the case is exemplified where the vertical transistor chip is used as the semiconductor chips Q1 to Q4. Accordingly, the drain electrode D is disposed on the wiring patterns 10 to 40 side and hence, the drain electrode D cannot be visually recognized thereby a symbol "D" that indicates the drain electrode is not illustrated. Further, the gate electrode G is disposed on surfaces of the semiconductor chips Q1 to Q4 on a source electrode S side.

Further, the semiconductor chips Q1 to Q4 are suitably changeable within a range that the gist of the present invention is not changed. For example, as the semiconductor chips Q1 to Q4, for example, a lateral-type transistor chip (for example, a GaN-HEMT made of a GaN on Si material, or a compound semiconductor transistor made of a $Ga_2O_3$ on Si material or the like) may be also used. In the case of the lateral-type transistor chip, it is preferable that gate electrodes G and source electrodes S be formed in plurals on a surface of the semiconductor chip including the drain electrode D. Further, semiconductor chips Q1 to Q4 are not limited to a transistor chip, may have a modified configuration where a transistor chip is replaced with a diode chip corresponding to a circuit application. By adopting such a modified configuration, the present invention is also applicable to a suitable totem pole type bridgeless PFC circuit and the like.

A first power source terminal 51 is connected to the first wiring pattern 10, and the first semiconductor chip Q1 and the third semiconductor chip Q3 are mounted on the first wiring pattern 10. In the embodiment, the first wiring pattern 10 has a portion that extends along an x-axis direction and a portion that extends along a y-axis direction in FIG. 2. The first semiconductor chip Q1 and the third semiconductor chip Q3 are mounted on the portion of the first wiring pattern 10 that extends in the x-axis direction. The first power source terminal 51 is connected to the portion of the first wiring pattern 10 that extends along the y-axis direction.

The second power source terminal 52 is connected to the second wiring pattern 20. In the embodiment, the second wiring pattern 20 has a portion that extends along the x-axis direction in FIG. 2, and a portion that is disposed between the third wiring pattern 30 and the fourth wiring pattern 40 and extends along the y-axis direction in FIG. 2. The second power source terminal 52 is connected to the portion of the second wiring pattern 20 that extends in the x-axis direction. Further, an end portion of the portion of the second wiring pattern 20 that extends along the y-axis direction is disposed adjacently to the first wiring pattern 10.

The third wiring pattern 30 is, as viewed in a plan view, disposed between the first wiring pattern 10 and the second wiring pattern 20, the second semiconductor chip Q2 is mounted on the third wiring pattern 30, and a first intermediate point terminal 61 is connected to the third wiring pattern 30.

The fourth wiring pattern 40 is, as viewed in a plan view, disposed between the first wiring pattern 10 and the second wiring pattern 20, the fourth semiconductor chip Q4 is mounted on the fourth wiring pattern 40, and a second intermediate point terminal 62 is connected to the fourth wiring pattern 40.

Next, the semiconductor chips Q1 to Q4 are described.

The source electrode S of the first semiconductor chip Q1 is connected to the third wiring pattern 30 via a first connection member 81 such as an aluminum wire. The drain electrode D of the first semiconductor chip Q1 is connected to the first wiring pattern 10.

The source electrode S of the second semiconductor chip Q2 is connected to the second wiring pattern 20 via a second connection member 82 such as an aluminum wire. The drain electrode D of the second semiconductor chip Q2 is connected to the third wiring pattern 30.

The source electrode S of the third semiconductor chip Q3 is connected to the fourth wiring pattern 40 via a third connection member 83 such as an aluminum wire. The drain electrode D of the third semiconductor chip Q3 is connected to the first wiring pattern 10.

The source electrode S of the fourth semiconductor chip Q4 is connected to the second wiring pattern 20 via a fourth connection member 84 such as an aluminum wire. The drain electrode D of the fourth semiconductor chip Q4 is connected to the fourth wiring pattern 40.

The semiconductor module 1 further includes first to fourth control terminals T11 to T14 and first to fourth detection terminals T21 to T24. Further, as wiring patterns that are formed on the substrate 70 described above, besides the above-mentioned wiring patterns 10 to 40, first to fourth control wiring patterns 111 to 114 and first to fourth detection wiring patterns 121 to 124 are present.

The first to fourth control terminals T11 to T14 are connected to the first to fourth control wiring patterns 111 to 114 respectively corresponding to the first to fourth control terminals T11 to T14. Further, the first to fourth detection terminals T21 to T24 are connected to the first to fourth detection wiring patterns 121 to 124 respectively corresponding to the first to fourth detection terminals T21 to T24.

The first to fourth control wiring patterns 111 to 114 are connected to the gate electrodes G of the semiconductor chips Q1 to Q4 that correspond to the first to fourth control wiring patterns 111 to 114 respectively via connection members such as aluminum wires respectively. Accordingly, it may be also referred to that the gate electrodes G of the semiconductor chips Q1 to Q4 are respectively connected to the first to fourth control terminals T11 to T14 on a one-to-one basis such that the gate electrode G is connected to the corresponding control terminal out of the first to fourth control terminals T11 to T14

On the other hand, the first to fourth detection wiring patterns 121 to 124 are connected to the source electrodes S of the semiconductor chips Q1 to Q4 via connection members such as aluminum wires respectively. Accordingly, it may be also referred to that the source electrodes S of the semiconductor chips Q1 to Q4 are respectively connected to the first to fourth detection terminals T21 to T24 on a one-to-one basis such that the source electrode S is connected to the corresponding detection terminal out of the first to fourth detection terminals T21 to T24.

Subsequently, the first and second power source terminals 51, 52 and the first and second intermediate point terminals 61, 62 are described. The first and second power source terminals 51, 52 are terminals for supplying power to the bridge circuit. As viewed as the flow of a current, the first power source terminal 51 forms an inlet side of the current, and the second power source terminal 52 forms an outlet side of the current.

The first power source terminal 51 is connected to the first wiring pattern 10. The second power source terminal 52 is connected to the second wiring pattern 20. These first power source terminal 51 and the second power source 52 are disposed adjacently to each other.

On the other hand, the first intermediate point terminal 61 and the second intermediate point terminal 62 are terminals to which a load not illustrated in the drawing are connected. The first intermediate point terminal 61 is connected to the third wiring pattern 30 while straddling over the second wiring pattern 20 in a non-contact manner, and the second intermediate point terminal 62 is connected to the fourth wiring pattern 40 while straddling over the second wiring pattern 20 in a non-contact manner. These first intermediate point terminal 61 and second intermediate point terminal 62 are disposed adjacently to each other. In such a configuration, the direction of a current that flows between the first intermediate point terminal 61 and the second intermediate point terminal 62 is opposite between when both the first semiconductor chip Q1 and the fourth semiconductor chip Q4 are turned on and when both the third semiconductor chip Q3 and the second semiconductor chip Q2 are turned on.

In this specification, "disposed adjacently" means, by focusing of on two constitutional elements of the same kind, that a constitutional element of the same kind as the above-mentioned two constitutional elements is not disposed between such two constitutional elements.

In the semiconductor module 1 according to the embodiment, when both the first semiconductor chip Q1 and the fourth semiconductor chip Q4 are turned on, a current flows from the first intermediate point terminal 61 to the second intermediate point terminal 62. On the other hand, when both the third semiconductor chip Q3 and the second semiconductor chip Q2 are turned on, a current flows from the second intermediate point terminal 62 to the first intermediate point terminal 61. The overall current path in the semiconductor module 1 according to the embodiment is described later.

Further, as illustrated in FIG. 1 and FIG. 2, an outer lead portion of the first power source terminal 51 and an outer lead portion of the second power source terminal 52, an outer lead portion of the first intermediate point terminal 61 and an outer lead portion of the second intermediate point terminal 62 are disposed on the same side of the semiconductor module 1. In this embodiment, "the same side of the semiconductor module 1" means, to take the case illustrated in FIG. 2, that these constitutional elements are disposed on the same side of the semiconductor module 1 (a side of a lower side in the drawing in case of the first and the second power source terminals 51, 52 and the first and the second intermediate point terminals 61, 62). Further, the outer lead portion means a portion that exists outside a resin when resin sealing is applied to the semiconductor module. Although resin sealing is applied to the semiconductor module 1 according to the embodiment 1, in FIG. 2, to illustrate the inner configuration of the semiconductor module 1, a symbol M is given to the resin and only an outer edge of the resin is illustrated with respect to the resin. The same understanding is also applicable to the configurations illustrated in FIG. 4 to FIG. 6 described later.

Further, outer lead portions of the first to fourth control terminals T11 to T14 and outer lead portions of the first to fourth detection terminals T21 to T24 are disposed on one side of the semiconductor module 1, and an outer lead portion of the first power source terminal 51 and an outer lead portion of the second power source terminal 52 and an outer lead portion of the first intermediate point terminal 61 and an outer lead portion of the second intermediate point terminal 62 are disposed on the other side of the semiconductor module 1 opposite to one side of the semiconductor module 1. In such a configuration, "one side of the semiconductor module 1 and the other side of the semiconductor module 1 opposite to one side of the semiconductor module 1" means, in the example illustrated in FIG. 2, an upper side of the semiconductor module 1 illustrated in FIG. 2 and a lower side of the semiconductor module 1 illustrated in FIG. 2.

The semiconductor module 1 includes a decoupling capacitor 90, one end of the decoupling capacitor 90 is connected to the first wiring pattern 10, and the other end of the decoupling capacitor 90 is connected to the second wiring pattern 20. the decoupling capacitor 90 has a function of avoiding a fluctuation of power source voltage and of removing various noises.

Figure 3:
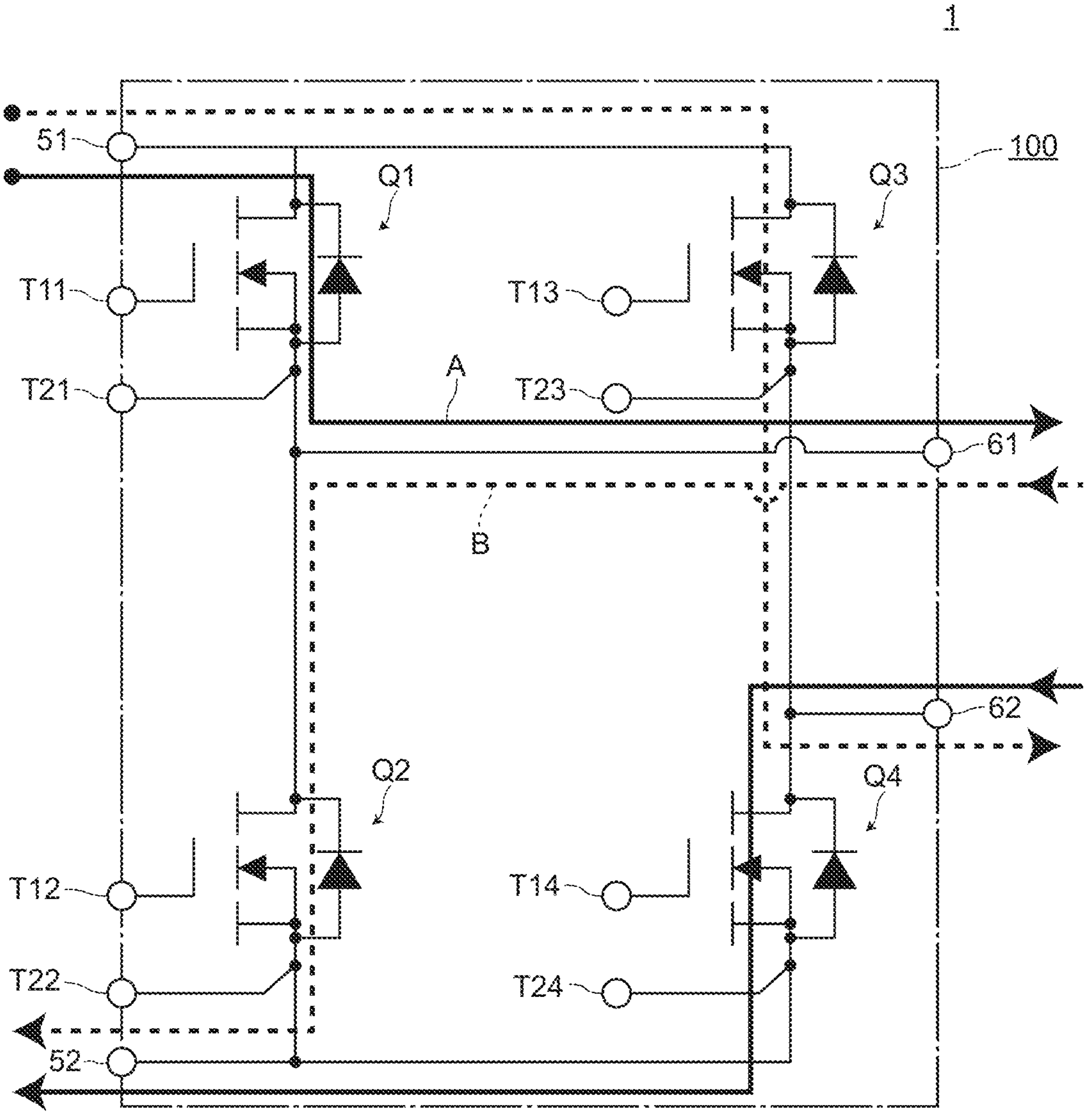
FIG. 3 is an equivalent circuit diagram of a bridge circuit 100 of the semiconductor module 1 according to the embodiment illustrated in FIG. 2.

FIG. 3 is an equivalent circuit diagram of the bridge circuit 100 of the semiconductor module 1 illustrated in FIG. 2. In FIG. 3, the constitutional elements identical to the constitutional elements illustrated in FIG. 2 are given the same symbols. The bridge circuit 100 illustrated in FIG. 3 is, as described previously, the bridge circuit where the first semiconductor chip Q1 and the third semiconductor chip Q3 form the high side, and the second semiconductor chip Q2 and the fourth semiconductor chip Q4 form the low side.

In such a bridge circuit 100, by applying a predetermined voltage to the respective gate electrodes G of the first semiconductor chip Q1 and the fourth semiconductor chip Q4 simultaneously, both the first semiconductor chip Q1 and the fourth semiconductor chip Q4 are turned on. Further, by applying a predetermined voltage to the respective gate electrodes G of the third semiconductor chip Q3 and the second semiconductor chip Q2, both the third semiconductor chip Q3 and the second semiconductor chip Q2 are turned on.

In such a bridge circuit 100, a current path when both the first semiconductor chip Q1 and the fourth semiconductor chip Q4 are turned on is, as indicated by a solid line A in FIG. 3, a path where a current flows from the first power source terminal 51, flows through the first semiconductor chip Q1 and reaches the first intermediate point terminal 61 and, after flowing through a load not illustrated in the drawing from the first intermediate point terminal 61, flows from the second intermediate point terminal 62, flows through the fourth semiconductor chip Q4 and reaches the second power source terminal 52.

On the other hand, a current path when both the third semiconductor chip Q3 and the second semiconductor chip Q2 are turned on is, as indicated by a broken line B in FIG. 3, a path where a current flows from the first power source terminal 51, flows through the third semiconductor chip Q3 and reaches the second intermediate point terminal 62 and, after flowing through a load not illustrated in the drawing from the second intermediate point terminal 62, flows from the first intermediate point terminal 61, flows through the second semiconductor chip Q2 and reaches the second power source terminal 52.

Figure 4:
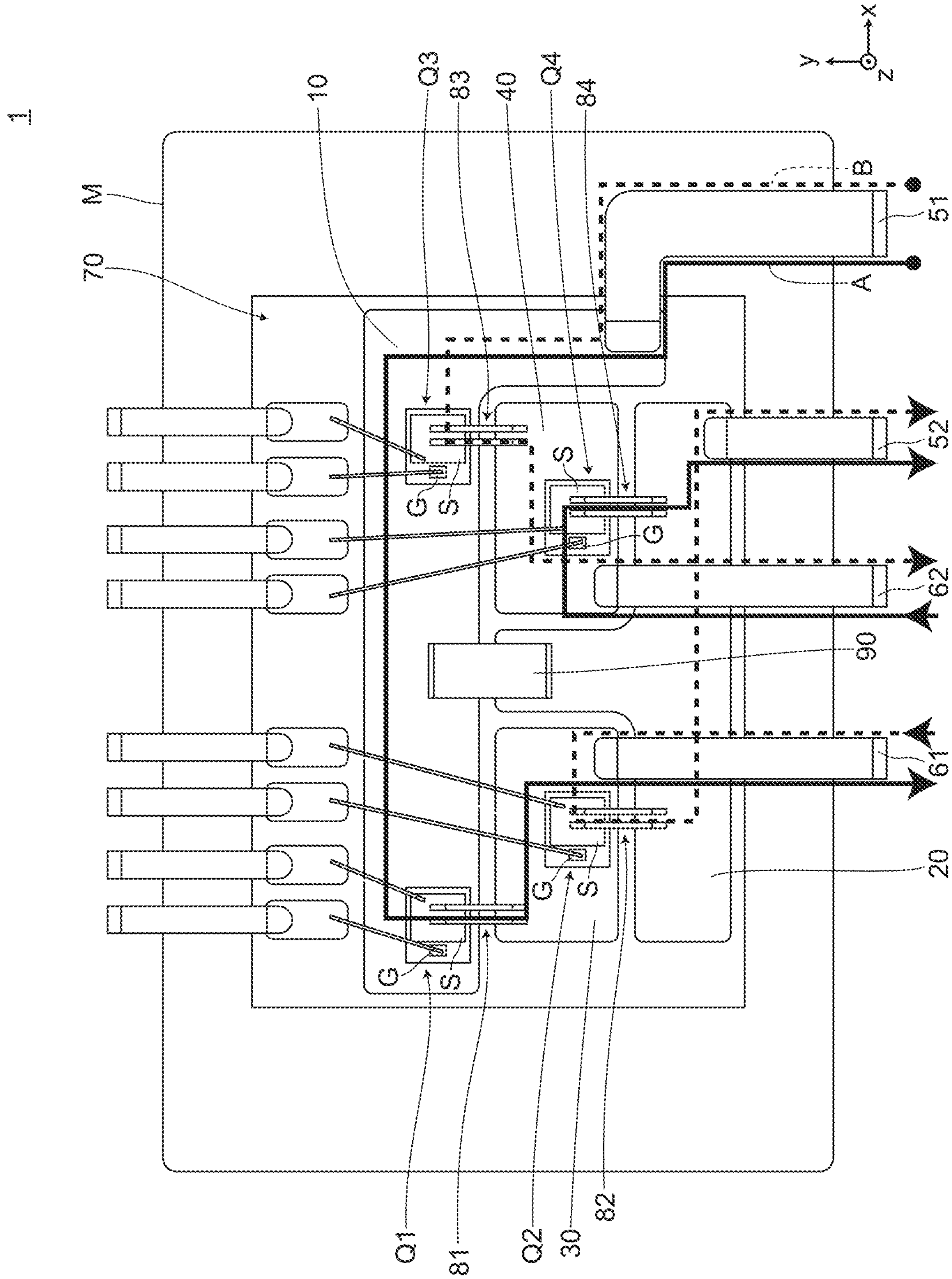
FIG. 4 is an explanatory view of a current path of the semiconductor module 1 according to the embodiment.

Such current paths are described specifically with reference to FIG. 4 that is an explanatory view of the current paths of the semiconductor module 1 according to the embodiment. FIG. 4 is a view illustrating the configuration obtained by adding the current paths to the semiconductor module 1 according to the embodiment. Accordingly, the semiconductor module 1 illustrated in FIG. 4 has substantially the same configuration as the semiconductor module 1 illustrated in FIG. 1. However, in FIG. 4, with respect to the symbols indicating the respective constitutional elements in FIG. 2, some symbols are omitted, and mainly, the symbols of the constitutional elements necessary for the description of the current paths are described.

The current path when both the first semiconductor chip Q1 and the fourth semiconductor chip Q4 are turned on forms a path indicated by a solid line A in FIG. 4. Specifically, a current from the first power source terminal 51 enters the first wiring pattern 10, and flows through the drain electrode D (not illustrated in the drawing) of the first semiconductor chip Q1 mounted on the first wiring pattern 10 via the source electrode S, and flows to the first intermediate point terminal 61 through the third wiring pattern 30 via the first connection member 81 that connects the source electrode S and the third wiring pattern 30. Then, the current enters the fourth wiring pattern 40 from the second intermediate point terminal 62 via the load not illustrated in the drawing, and flows from the drain electrode D (not illustrated in the drawing) of the fourth semiconductor chip Q4 mounted on the fourth wiring pattern 40 to the source electrode S of the fourth semiconductor chip Q4, and flows to the second power source terminal 52 through the second wiring pattern 20 via the fourth connection member 84 that connects the source electrode S and the second wiring pattern 20.

On the other hand, the current path when both the third semiconductor chip Q3 and the second semiconductor chip Q2 are turned on forms a path indicated by a solid line B in FIG. 3. Specifically, a current from the first power source terminal 51 enters the first wiring pattern 10, and flows through the drain electrode D (not illustrated in the drawing) of the third semiconductor chip Q3 mounted on the first wiring pattern 10 via the source electrode S, and flows to the second intermediate point terminal 62 through the fourth wiring pattern 40 via the third connection member 83 that connects the source electrode S and the fourth wiring pattern 40. Then, the current enters the third wiring pattern 30 from the first intermediate point terminal 61 via the load not illustrated in the drawing, and flows through the drain electrode D (not illustrated in the drawing) of the second semiconductor chip Q2 mounted on the third wiring pattern 30 via the source electrode S, and flows to the second power source terminal 52 through the second wiring pattern 20 from the second connection member 82 that connects the source electrode S and the second wiring pattern 20.

In this manner, at a time of using the semiconductor module 1, the currents flow in opposite directions with respect to the first power source terminal 51 and the second power source terminal 52, and the currents flow in opposite directions with respect to the first intermediate point terminal 61 and the second intermediate point terminal 62.

As described above, in the semiconductor module 1 according to the embodiment, the first power source terminal 51 and the second power source terminal 52 are disposed adjacently to each other, and the first intermediate point terminal 61 and the second intermediate point terminal 62 are disposed adjacently to each other. Further, in the semiconductor module 1, in both the case where an operation of turning on both the first semiconductor chip Q1 and the fourth semiconductor chip Q4 is performed and the case where an operation of turning on both the third semiconductor chip Q3 and the second semiconductor chip Q2 is performed, the direction of the current that flows in the first power source terminal 51 and the direction of the current that flows in the second power source terminal 51 become directions opposite to each other and, at the same time, the direction of the current that flows in the first intermediate point terminal 61 and the direction of the current that flows in the second intermediate point terminal 62 become directions opposite to each other. In this manner, by arranging the terminals having the different current flow directions adjacently to each other, it is possible to make the generated magnetic fields cancel each other. Accordingly, it is possible to reduce the parasitic inductance.

As has been described above, according to the semiconductor module 1 of the present invention, it is possible to acquire advantageous effects such as the reduction of the parasitic inductance. To verify these advantageous effects, the inventors of the present invention carried out a simulation. The result of the simulation is described below.

Figure 5:
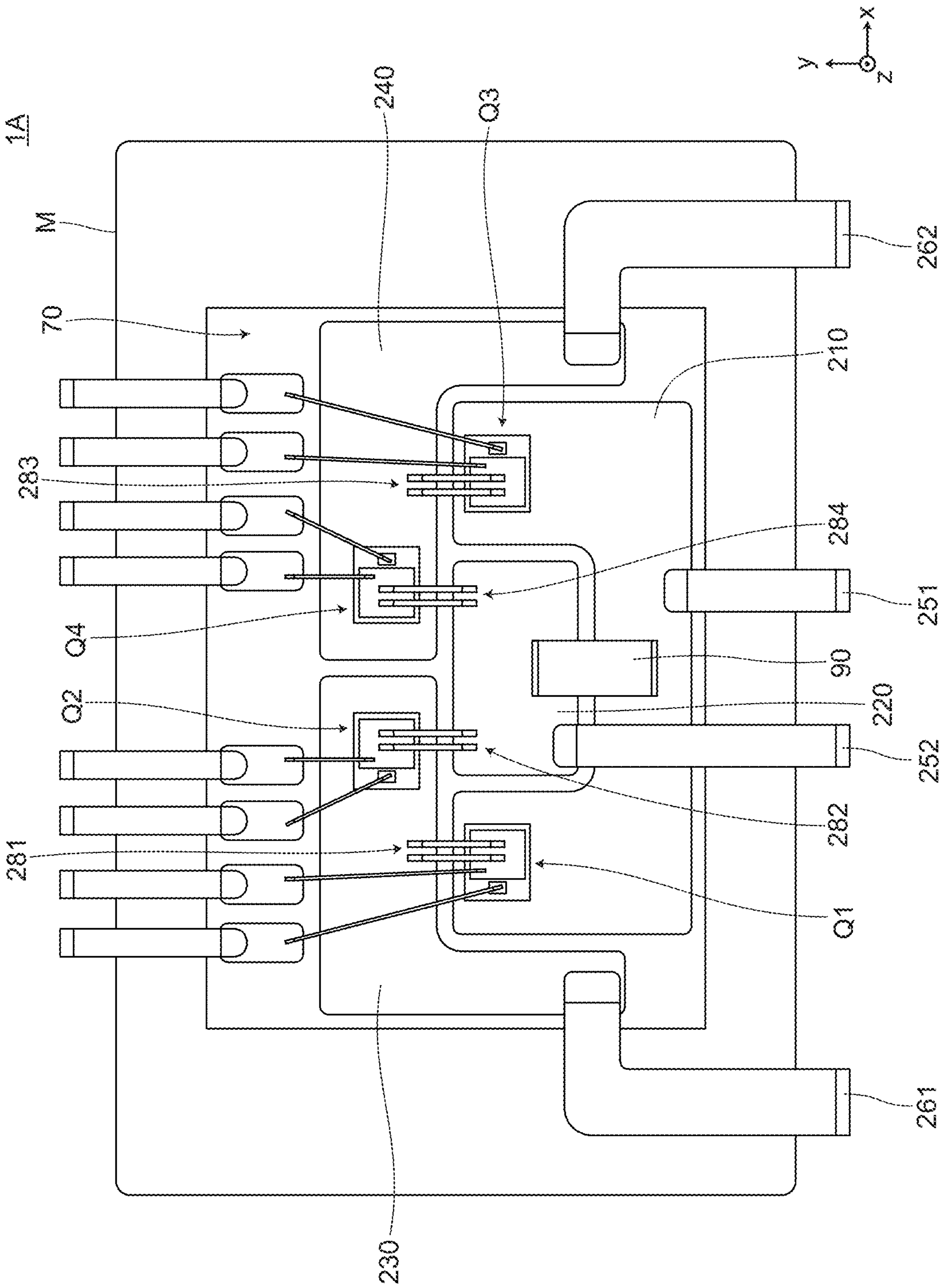
FIG. 5 is a plan view of the internal configuration of a semiconductor module 1A prepared for comparison with the semiconductor module 1 according to the embodiment for performing simulation.

FIG. 5 is a plan view of the internal configuration of the semiconductor module 1A prepared for comparison with the semiconductor module 1 according to the embodiment. In the description made hereinafter, the semiconductor module 1A prepared for comparison may be simply also expressed as "semiconductor module 1A".

The semiconductor module 1A has basically substantially the same constitutional elements as the semiconductor module 1 according to the embodiment. In FIG. 5, with respect to symbols that indicate the constitutional elements of the semiconductor module 1A, the symbols necessary for the description of the semiconductor module 1A are indicated. In this embodiment, with respect to the semiconductor module 1A, the first to fourth wiring patterns 10 to 40 according to the semiconductor module 1 of the embodiment are assumed as a first to fourth wiring patterns 210 to 240, the first and second power source terminals 51, 52 are assumed as first and second power source terminals 251, 252, the first and second intermediate point terminals 61, 62 are assumed as first and second intermediate point terminal 261, 262, and the first to fourth connection members 81 to 84 are assumed as first to fourth connection members 281 to 284.

With respect to the first to fourth semiconductor chips Q1 to Q4 according to the semiconductor module 1 of the embodiment, also in the semiconductor module 1A, the first to fourth semiconductor chips Q1 to Q4 are set as the first to fourth semiconductor chips Q1 to Q4, and a substrate 70 according to the semiconductor module 1 of the embodiment is also set as the substrate 70 in the semiconductor module 1A. Further, also in this embodiment, in a case where the first to fourth semiconductor chips Q1 to Q4 are collectively described, the first to fourth semiconductor chips Q1 to Q4 may be expressed as the semiconductor chips Q1 to Q4. In a case where the first to fourth wiring pattern 210 to 240 are collectively described, the first to fourth wiring patterns 210 to 240 may be expressed as the wiring patterns 210 to 240.

The configuration of the bridge circuit of the semiconductor module 1A is substantially equal to the semiconductor module 1 according to the embodiment. That is, the bridge circuit of the semiconductor module 1A is a bridge circuit where the first semiconductor chip Q1 and the third semiconductor chip Q3 form a high side, and the second semiconductor chip Q2 and the fourth semiconductor chip Q4 form a low side. Both the first semiconductor chip Q1 and the fourth semiconductor chip Q4 are turned on, and both third semiconductor chip Q3 and the second semiconductor chip Q2 are turned on.

Further, in the semiconductor module 1A, the first power source terminal 251 is connected to the first wiring pattern 210, and the second power source terminal 252 is connected to the second wiring pattern 220 while straddling over the first wiring pattern 210 in a non-contact manner. The first intermediate point terminal 261 is connected to the third wiring pattern 230, and the second intermediate point terminal 262 is connected to the fourth wiring pattern 240.

However, in the semiconductor module 1A, the first intermediate point terminal 261 and the second intermediate point terminal 262 are not disposed adjacently to each other. That is, the first intermediate point terminal 261 and the second intermediate point terminal 262 are disposed in a spaced-apart manner at both end portions (a left end portion and a right end portion) of the substrate 70.

Further, in the semiconductor module 1A, the first semiconductor chip Q1 is connected to the third wiring pattern 230 via the first connection member 281. The second semiconductor chip Q2 is connected to the second wiring pattern 220 via the second connection member 282. The third semiconductor chip Q3 is connected to the fourth wiring pattern 240 via the third connection member 283. The fourth semiconductor chip Q4 is connected to the second wiring pattern 220 via the fourth connection member 284.

Figure 6:
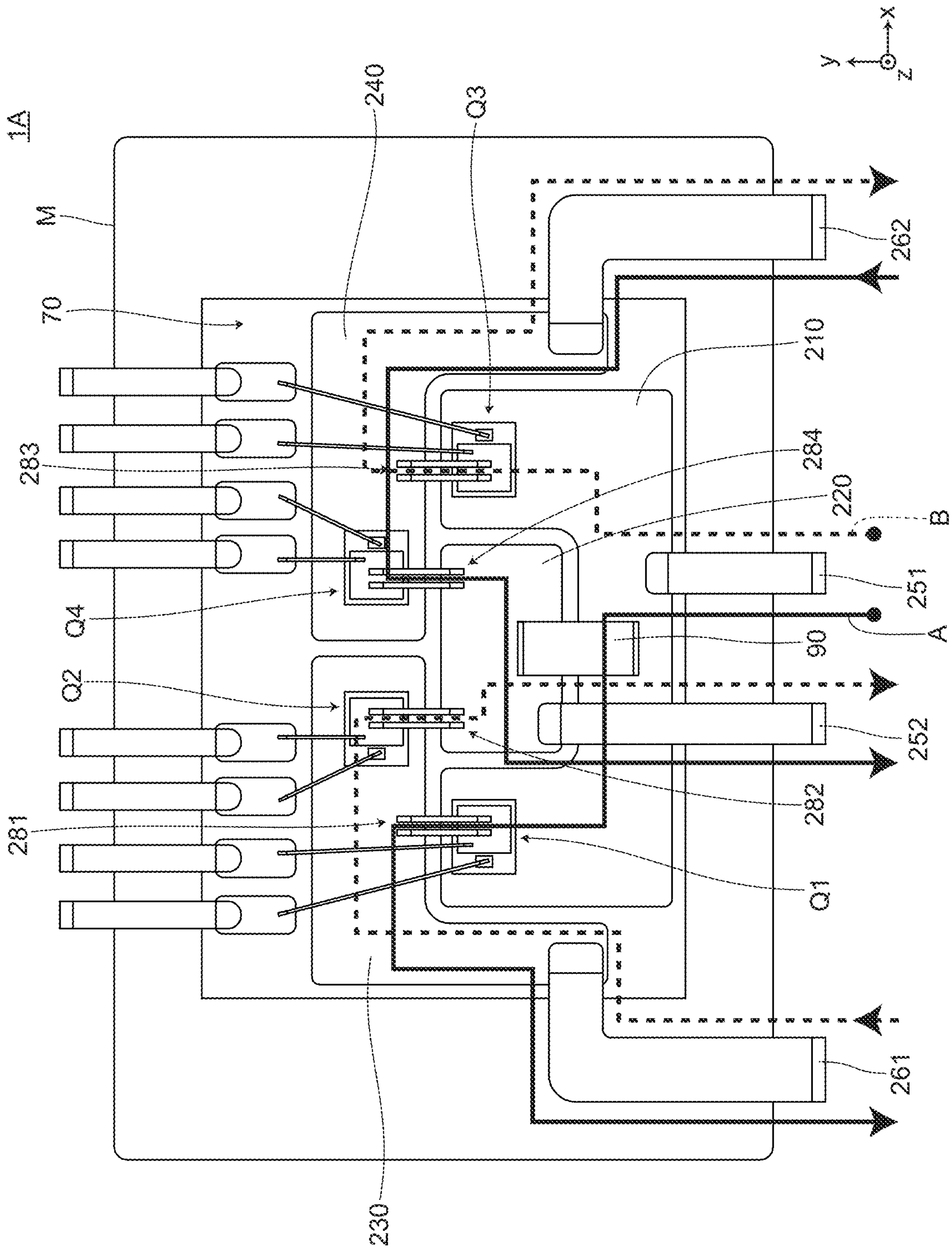
FIG. 6 is an explanatory view of a current path of the semiconductor module 1A prepared for comparison.
Figure 7:
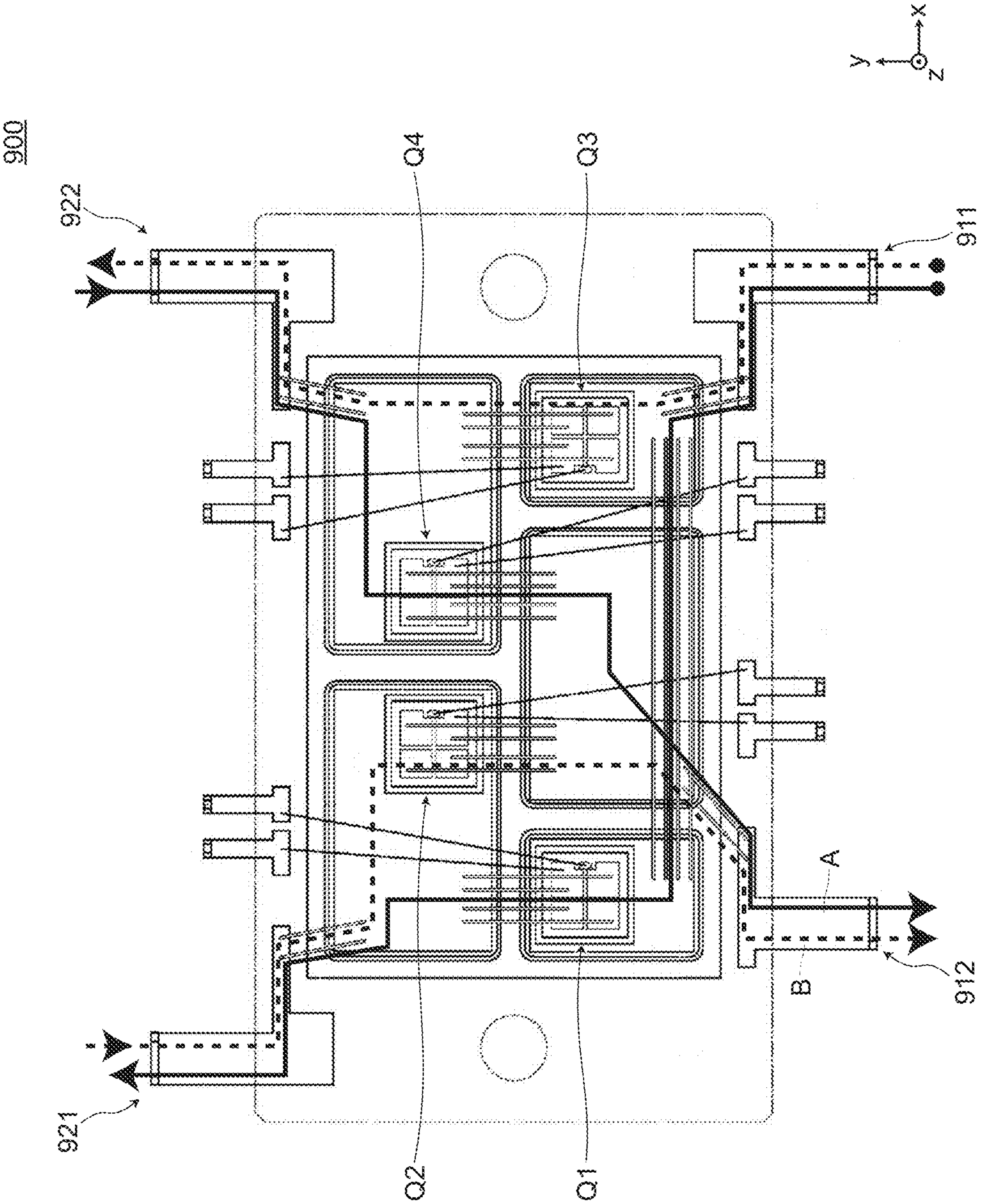
FIG. 7 is a plan view of the internal configuration of a semiconductor device 900 described in patent literature 1.

FIG. 6 is an explanatory view of a current paths of the semiconductor module 1A prepared for comparison. FIG. 6 is a view illustrating the configuration obtained by adding the current paths to the semiconductor module 1A illustrated in FIG. 5. Accordingly, the semiconductor module 1A illustrated in FIG. 6 has substantially the same configuration as the semiconductor module 1A illustrated in FIG. 5. The current paths of the semiconductor module 1A become paths indicated by a solid line A in FIG. 6 when both of the first semiconductor chip Q1 and the fourth semiconductor chip Q4 are turned on. The current paths of the semiconductor module 1A become paths indicated by a broken line B in FIG. 6 when both the third semiconductor chip Q3 and the second semiconductor chip Q2 are turned on.

Hereinafter, the description is made with respect to a result obtained by comparing, by simulation, a parasitic inductance generated in the semiconductor module 1 according to the embodiment and a parasitic inductance generated in the semiconductor module 1A. Here, assuming frequency of a turn on/off operation of the bridge circuit as 100 kHz, a parasitic inductance that was generated in the current paths when the first semiconductor chip Q1 and the fourth semiconductor chip Q4 were turned on, and a parasitic inductance that was generated in the current paths when the third semiconductor chip Q3 and the second semiconductor chip Q2 were turned on are measured.

In the semiconductor module 1A, a parasitic inductance that was generated in the current path A when both the first semiconductor chip Q1 and the fourth semiconductor chip Q4 were turned on (see FIG. 6) was 48.4 nanohenry (48.4 nH), and a parasitic inductance that was generated in the current path B when both the third semiconductor chip Q3 and the second semiconductor chip Q2 were turned on (see FIG. 6) was 36.3 nanohenry (36.3 nH).

On the other hand, in the semiconductor module 1 according to the embodiment, a parasitic inductance that was generated in the current path A when both the first semiconductor chip Q1 and the fourth semiconductor chip Q4 were turned on (see FIG. 4) was 29.6 nanohenry (29.6 nH), and a parasitic inductance that was generated in the current path B when both the third semiconductor chip Q3 and the second semiconductor chip Q2 were turned on (see FIG. 4) was 29.2 nanohenry (29.2 nH).

It was confirmed from this result that the semiconductor module 1 according to the embodiment can reduce a parasitic inductance compared to the semiconductor module 1A in both the case where the first semiconductor chip Q1 and the fourth semiconductor chip Q4 are turned on and the case where both the third semiconductor chip Q3 and the second semiconductor chip Q2 are turned on.

As has been explained above, in the semiconductor module 1 according to the embodiment, the first power source terminal 51 and the second power source terminal 52 are disposed adjacently to teach other, and the first intermediate point terminal 61 and the second intermediate point terminal 62 are disposed adjacently. At a time of using the semiconductor module 1, currents flow in opposite directions with respect to the first power source terminal 51 and the second power source terminal 52 and, at the same time, currents flow in the opposite directions with respect to the first intermediate point terminal 61 and the second intermediate point terminal 62. Accordingly, in the semiconductor module 1 of the embodiment, it is possible to make a magnetic field generated in the first power source terminal 51 and a magnetic field generated in the second power source terminal 52 cancel each other and, at the same time, it is possible to make a magnetic field generated in the first intermediate point terminal 61 and a magnetic field generated in the second intermediate point terminal 62 cancel each other and hence, it is possible to provide the semiconductor module that can reduce a parasitic inductance.

Further, according to the semiconductor module 1 of the embodiment, the first power source terminal 51 is connected to the first wiring pattern 10, and the first semiconductor chip Q1 and the third semiconductor chip Q3 are mounted on the first wiring pattern 10. The second power source terminal 52 is connected to the second wiring pattern 20. The third wiring pattern 30 is, as viewed in a plan view, disposed between the first wiring pattern 10 and the second wiring pattern 20, the second semiconductor chip Q2 is mounted on the third wiring pattern 30, and the first intermediate point terminal 61 is connected to the third wiring pattern 30. The fourth wiring pattern 40 is, as viewed in a plan view, disposed between the first wiring pattern 10 and the second wiring pattern 20, the fourth semiconductor chip Q4 is mounted on the fourth wiring pattern 40, and the second intermediate point terminal 62 is connected to the fourth wiring pattern 40. The source electrode S of the first semiconductor chip Q1 is connected to the third wiring pattern 30 via the first connection member 81. The drain electrode D of the first semiconductor chip Q1 is connected to the first wiring pattern 10. The source electrode S of the second semiconductor chip Q2 is connected to the second wiring pattern 20 via the second connection member 82. The drain electrode D of the second semiconductor chip Q2 is connected to the third wiring pattern 30. The source electrode S of the third semiconductor chip Q3 is connected to the fourth wiring pattern 40 via the third connection member 83. The drain electrode D of the third semiconductor chip Q3 is connected to the first wiring pattern 10. The source electrode S of the fourth semiconductor chip Q4 is connected to the second wiring pattern 20 via the fourth connection member 84. The drain electrode D of the fourth semiconductor chip Q4 is connected to the fourth wiring pattern 40. With such a configuration, in the semiconductor module 1, the current path (solid line A) when both the first semiconductor chip Q1 and the fourth semiconductor chip Q4 are turned on and the current path (broken line B) when both the semiconductor chip Q3 and the second semiconductor chip Q2 are turned on can be collected in a compact manner. Accordingly, the current path when both the first semiconductor chip Q1 and the fourth semiconductor chip Q4 are turned on, and the current path when both the third semiconductor chip Q3 and the second semiconductor chip Q2 are turned on can be shortened respectively and hence, it is possible to realize the further reduction of a parasitic inductance at the time of operating the bridge circuit.

Further, according to the semiconductor module 1 of the embodiment, the outer lead portions of the first to fourth control terminals T11 to T14 are disposed one side of the semiconductor module 1, and the outer lead portion of the first power source terminal 51, the outer lead portion of the second power source terminal 52, the outer lead portion of the first intermediate point terminal 61, and the outer lead portion of the second intermediate point terminal 62 are disposed on the other side of the semiconductor module 1 opposite to one side of the semiconductor module 1. Accordingly, the first to fourth control terminal T11 to T14 can be spaced apart from the terminals through which a large current flows and hence, it is possible to reduce the mutual influence.

Further, according to the semiconductor module 1 of the embodiment, the outer lead portions of the first to fourth detection terminals T21 to T24 are disposed on one side of the semiconductor 1, and the outer lead portion of the first power source terminal 51, the outer lead portion of the second power source terminal 52, the outer lead portion of the first intermediate point terminal 61 and the outer lead portion of the second intermediate point terminal 62 are disposed on the other side of the semiconductor module 1 opposite to one side of the semiconductor module 1. Accordingly, the first to fourth detection terminals T21 to T24 can be spaced apart from the terminals through which a large current flows and hence, it is possible to reduce the mutual influence.

The present invention is not limited to the above-mentioned embodiment, and various modifications are conceivable without departing from the gist of the present invention. For example, the following modifications are also conceivable.

(1) The shapes, the numbers, the sizes, the positions and the like of the constitutional elements of the semiconductor modules according to the present invention are not limited to the values illustrated in FIG. 2, and can be suitably changed unless the technical features of the present invention are not jeopardized.

(2) The semiconductor chips Q1 to Q4 are not limited to a MOSFET, and may be other semiconductor chips such as an insulated gate bipolar transistor (IGBT).

(3) In the above-mentioned embodiment, the semiconductor module 1 includes four semiconductor chips Q1 to Q4. The present invention is not limited to such a case. The present invention is applicable to other semiconductor modules in each of which the number of semiconductor chips is not four.

REFERENCE SIGNS LIST

1: semiconductor module
1A: semiconductor module prepared for comparison
10: first wiring pattern
20: second wiring pattern
30: third wiring pattern
40: fourth wiring pattern
51: first power source terminal
52: second power source terminal
61: first intermediate point terminal
62: second intermediate point terminal
70: substrate
81 to 84: first to fourth connection members
90: decoupling capacitor
111 to 114: first to fourth control wiring patterns
121 to 124: first to fourth detection wiring patterns
210: first wiring pattern of semiconductor module 1A
220: second wiring pattern of semiconductor module 1A
230: third wiring pattern of semiconductor module 1A
240: fourth wiring pattern of semiconductor module 1A
251: first power source terminal of semiconductor module 1A
252: second power source terminal of semiconductor module 1A
261: first intermediate terminal of point semiconductor module 1A
262: second intermediate point terminal of semiconductor module 1A
Q1: first semiconductor chip
Q2: second semiconductor chip
Q3: third semiconductor chip
Q4: fourth semiconductor chip
G: gate electrodes of semiconductor chips Q1 to Q4
S: source electrodes of semiconductor chips Q1 to Q4
T11 to T14: first to fourth control terminals
T21 to T24: first to fourth detection terminals
M: outer edge of resin

The invention claimed is:

1. A semiconductor module comprising: a plurality of semiconductor chips; a first power source terminal; a second power source terminal; a first intermediate point terminal and a second intermediate point terminal thus forming a bridge circuit in the semiconductor module, wherein the first power source terminal and the second power source terminal are disposed adjacently to each other, the first intermediate point terminal and the second intermediate point terminal are disposed adjacently to each other, and at a time using the semiconductor module, currents flow in opposite directions with respect to the first power source terminal and the second power source terminal, and currents flow in opposite directions with respect to the first intermediate point terminal and the second intermediate point terminal, and an outer lead portion of the first power source terminal and an outer lead portion of the second power source terminal, and an outer lead portion of the first intermediate point terminal and an outer lead portion of the second intermediate point terminal are disposed on a same side of the semiconductor module.

2. The semiconductor module according to claim 1, further comprising first to fourth wiring patterns, wherein the plurality of semiconductor chips are first to fourth semiconductor chips each having a first electrode and a second electrode, the bridge circuit is configured such that the first semiconductor chip and the third semiconductor chip form a high side, and the second semiconductor chip and the fourth semiconductor chip form a low side, the first power source terminal is connected to the first wiring pattern, and the first semiconductor chip and the third semiconductor chip are mounted on the first wiring pattern, the second power source terminal is connected to the second wiring pattern, the third wiring pattern is, as viewed in a plan view, disposed between the first wiring pattern and the second wiring pattern, the second semiconductor chip is mounted on the third wiring pattern, and the first intermediate point terminal is connected to the third wiring pattern, the fourth wiring pattern is, as viewed in a plan view, disposed between the first wiring pattern and the second wiring pattern, the fourth semiconductor chip is mounted on the fourth wiring pattern, and the second intermediate point terminal is connected to the fourth wiring pattern, a first electrode of the first semiconductor chip is connected to the third wiring pattern via a first connection member, a second electrode of the first semiconductor chip is connected to the first wiring pattern, a first electrode of the second semiconductor chip is connected to the second wiring pattern via a second connection member, a second electrode of the second semiconductor chip is connected to the third wiring pattern, a first electrode of the third semiconductor chip is connected to the fourth wiring pattern via a third connection member, a second electrode of the third semiconductor chip is connected to the first wiring pattern, a first electrode of the fourth semiconductor chip is connected to the second wiring pattern via a fourth connection member, and a second electrode of the fourth semiconductor chip is connected to the fourth wiring pattern.

3. The semiconductor module according to claim 2, further comprising first to fourth control terminals, wherein the first to fourth semiconductor chips further include control electrodes that are respectively connected to the first to fourth control terminals on a one-to-one basis such that the control electrode is connected to the corresponding control terminal out of the first to fourth control terminals, and outer lead portions of the first to fourth control terminals are disposed on one side, and the outer lead portion of the first power source terminal, the outer lead portion of the second power source terminal, the outer lead portion of the first intermediate point terminal, and the outer lead of the second intermediate point terminal are disposed on an other side of the semiconductor module opposite to the one side of the semiconductor module.

4. The semiconductor module according to claim 2, further comprising first to fourth detection terminals, wherein the first electrodes of the first to fourth semiconductor chips are respectively connected to the first to fourth detection terminals on a one-to-one basis such that the control electrode is connected to the corresponding detection terminal out of the first to fourth detection terminals, and outer lead portions of the first to fourth control terminals are disposed on one side, and the outer lead portion of the first power source terminal, the outer lead portion of the second power source terminal, the outer lead portion of the first intermediate point terminal, and the outer lead of the second intermediate point terminal are disposed on the other side of the semiconductor module opposite to the one side of the semiconductor module.

* * * * *